United States Patent
Luo

(10) Patent No.: US 11,249,528 B2
(45) Date of Patent: Feb. 15, 2022

(54) POWER SUPPLY DEVICE FOR SUPPLYING POWER TO SERVER AND POWER SUPPLY MANAGEMENT SYSTEM

(71) Applicant: ZHENGZHOU YUNHAI INFORMATION TECHNOLOGY CO., LTD., Henan (CN)

(72) Inventor: Siheng Luo, Henan (CN)

(73) Assignee: ZHENGZHOU YUNHAI INFORMATION TECHNOLOGY CO LTD, Henan (CN)

( * ) Notice: Subject to any disclaimer, the term of this patent is extended or adjusted under 35 U.S.C. 154(b) by 630 days.

(21) Appl. No.: 16/097,228

(22) PCT Filed: Dec. 28, 2017

(86) PCT No.: PCT/CN2017/119202
§ 371 (c)(1),
(2) Date: Oct. 26, 2018

(87) PCT Pub. No.: WO2019/024406
PCT Pub. Date: Feb. 7, 2019

(65) Prior Publication Data
US 2021/0223836 A1 Jul. 22, 2021

(30) Foreign Application Priority Data
Aug. 3, 2017 (CN) .......................... 201710657191.2

(51) Int. Cl.
*G06F 1/26* (2006.01)
*H03K 21/08* (2006.01)
*G06F 13/00* (2006.01)

(52) U.S. Cl.
CPC ................ *G06F 1/26* (2013.01); *G06F 13/00* (2013.01); *H03K 21/08* (2013.01); *G06F 1/266* (2013.01)

(58) Field of Classification Search
CPC ............ G06F 1/26; G06F 1/266; G06F 13/00; H03K 21/08
(Continued)

(56) References Cited

U.S. PATENT DOCUMENTS

2005/0068011 A1   3/2005   Miura
2009/0009187 A1*  1/2009   Kwak ................ G06F 13/4081
                                                        324/630
(Continued)

FOREIGN PATENT DOCUMENTS

CN   101639669 A   2/2010
CN   102780246 A   11/2012
(Continued)

OTHER PUBLICATIONS

Elliott Smith, "Understanding the Successive Approximation Register ADC", Dec. 28, 2015, retrieved from https://www.allaboutcircuits.com/technical-articles/understanding-analog-to-digital-converters-the-successive-approximation-reg/ (Year: 2015).*
(Continued)

*Primary Examiner* — Ji H Bae
(74) *Attorney, Agent, or Firm* — Yue (Robert) Xu; Apex Attorneys at Law, LLP

(57) ABSTRACT

A power supply device for supplying power to a server and a power supply management system are provided. The device includes: a power supply control chip, a first connector, a voltage comparator, a counter and a resistance regulation circuit. The resistance regulation circuit includes a pull-up resistance circuit and a pull-down resistance circuit including multiple resistor branches and switches. An input terminal of the voltage comparator is connected to an address input terminal, the other input terminal of the voltage comparator is connected to a connection point of the resistance regulation circuit. An input terminal of the coun-
(Continued)

ter is connected to an output terminal of the voltage comparator, each output terminal of the counter is connected to one switch and controls a state of the switch. Each output terminal of the counter is connected to one address pin of the power supply control chip.

9 Claims, 3 Drawing Sheets

(58) Field of Classification Search
USPC .......................................... 713/300; 710/3, 9
See application file for complete search history.

(56) References Cited

U.S. PATENT DOCUMENTS

| | | | |
|---|---|---|---|
| 2010/0026255 | A1 | 2/2010 | Tai |
| 2010/0228893 | A1* | 9/2010 | Hung ................. G06F 13/4068 710/16 |
| 2012/0198183 | A1* | 8/2012 | Wetzel ................ G06F 11/3013 711/154 |
| 2016/0357697 | A1* | 12/2016 | Landmann .......... G06F 13/4022 |
| 2018/0300281 | A1* | 10/2018 | Saastamoinen ..... G06F 13/4022 |
| 2019/0312448 | A1* | 10/2019 | Lim ...................... H02J 7/0027 |

FOREIGN PATENT DOCUMENTS

| | | |
|---|---|---|
| CN | 104571430 A | 4/2015 |
| CN | 105006961 A | 10/2015 |

OTHER PUBLICATIONS

International Search Report for PCT/CN2017/119202 dated May 3, 2018, ISA/CN.

\* cited by examiner

POWER SUPPLY DEVICE FOR SUPPLYING POWER TO SERVER AND POWER SUPPLY MANAGEMENT SYSTEM

The present application is the national phase of International Patent Application No. PCT/CN2017/119202, titled "POWER SUPPLY DEVICE FOR SUPPLYING POWER TO SERVER AND POWER SUPPLY MANAGEMENT SYSTEM", filed on Dec. 28, 2017, which claims the priority to Chinese Patent Application No. 201710657191.2, titled "POWER SUPPLY DEVICE FOR SUPPLYING POWER TO SERVER AND POWER SUPPLY MANAGEMENT SYSTEM", filed on Aug. 3, 2017 with the Chinese Patent Office, both of which are incorporated herein by reference in their entireties.

FIELD

The present disclosure relates to the technical field of power supply to servers, and in particular to a power supply device for supplying power to a server and a power supply management system.

BACKGROUND

At present, in a power supply management system for a server, two or more power supply devices are used to form a power supply module for supplying power to the server. In a data center for processing a huge amount of data, a redundant configuration manner of 2+2 or 4+4 power supply devices is mostly adopted for a power supply management system for a single server, and a power supply distribution panel is used to control an operating state of each of the power supply devices and monitor an operating parameter of each of the power supply devices. The power supply distribution panel communicates with a power supply control chip of each of the power supply devices via the same power supply management bus (PMBUS).

In order to assign an address for each of the power supply devices, it is required to arrange an address output terminal for each of connectors in the power supply distribution panel and the power supply devices, and an address output terminal of a power supply device is directly connected to an address pin of the power supply management chip of the power supply device. Since each of the address output terminals has only a high level state and a low level state, in a case where the power supply distribution panel is connected to two or more power supply devices, it is required to arrange multiple address output terminals for each of connectors in the power supply distribution panel and in the power supply devices. Taking a redundant configuration manner of 4+4 power supply devices (that is, eight power supply devices) as an example, in order to drive the eight power supply devices, it is required to arrange three address output terminals for each of the connectors in the power supply distribution panel and in the power supply devices.

However, since each of the connectors in the power supply distribution panel and in the power supply devices is provided with three address output terminals, a large size of each of the connectors may be caused. Specifically, in a case where the power supply distribution panel is provided with multiple connectors described above, a size of the power supply distribution panel may be increased accordingly, which is not conducive to reduce an overall size of the power supply distribution panel.

SUMMARY

A power supply device for supplying power to a server and a power supply management system are provided according to the present disclosure, to solve a problem of a large size of a connector due to that it is required to arrange multiple address output terminals for a connector between a conventional power supply device and a power supply distribution panel.

A power supply device for supplying power to a server is provided according to an embodiment of the present disclosure, which includes: a power supply control chip, a first connector, a voltage comparator, a counter and a resistance regulation circuit.

The first connector is configured to connect the power supply control chip to a power supply distribution panel.

The first connector includes only one address input terminal.

The resistance regulation circuit includes a pull-up resistance circuit and a pull-down resistance circuit connected in series. Multiple resistor branches and switches are arranged in the pull-up resistance circuit and/or the pull-down resistance circuit, each of the multiple resistor branches is provided with one of the switches. An input terminal of the voltage comparator is connected to the address input terminal, and the other input terminal of the voltage comparator is connected to a connection point of the resistance regulation circuit.

An input terminal of the counter is connected to an output terminal of the voltage comparator, and each of output terminals of the counter is connected to one of the switches, to control the switch to be in an on state or an off state.

Each of the output terminals of the counter is connected to one of address pins of the power supply control chip.

In an embodiment of the present disclosure, the counter is an octal counter including three output terminals.

The pull-up resistance circuit includes a first resistor.

The pull-down resistance circuit includes a first branch and a second branch connected in parallel.

The first branch includes a second resistor. The second branch includes a third resistor, a third branch and a fourth branch. The third branch and the fourth branch are connected in parallel with each other to form a branch, the branch is connected in series with the third resistor.

The third branch includes a fourth resistor. The fourth branch includes a fifth resistor and a sixth resistor connected in series.

The switches include a first switch, a second switch and a third switch.

The first switch is connected in series with the second resistor. The second switch is connected in series with the fourth resistor. The third switch is connected in series with the fifth resistor.

In an embodiment of the present disclosure, the first resistor, the second resistor, the third resistor, the fourth resistor, the fifth resistor and the sixth resistor have a same resistance value.

A power supply management system is further provided according to the present disclosure, which includes a power supply distribution panel and the power supply device described above. The power supply distribution panel includes at least three second connectors, and each of the at least three second connectors is connectable to the first connector of the power supply device. An address input terminal of each of the second connectors is connected to a pull-up resistor and a pull-down resistor.

A ratio between resistance values of the pull-up resistor and the pull-down resistor connected to the second connector is equal to a ratio between resistance values of the pull-up resistance circuit and the pull-down resistance circuit of the power supply device connected with the second connector.

A ratio between resistance values of the pull-up resistor and the pull-down resistor connected to one second connector is different from a ratio between resistance values of the pull-up resistor and the pull-down resistor connected to another second connector.

In an embodiment of the present disclosure, a resistance value of the pull-up resistor is equal to a resistance value of the pull-up resistance circuit of the power supply device connected with the second connector.

A resistance value of the pull-down resistor is equal to a resistance value of the pull-down resistance circuit of the power supply device connected with the second connector.

With the power supply device according to the embodiment, in a case where the power supply device is connected with the power supply distribution panel, the address input terminal of the voltage comparator receives a voltage signal with a certain voltage value, and inputs the voltage signal to the first input terminal of the voltage comparator. The voltage comparator compares the voltage signal at the first input terminal with a voltage signal at the second input terminal, and inputs a high level signal to the input terminal of the counter in a case where the voltage signal at the first input terminal is different from the voltage signal at the second input terminal. The counter performs accumulative counting in a case where the input terminal of the counter receives the high level signal and output a signal with a corresponding level at each of output terminals. Each of the switches is controlled to be in an on state or an off state through one of the output terminals of the counter, to change the resistance value of the pull-down resistance circuit, so as to change the voltage at the second input terminal. The above steps are repeated, until the voltages at the two input terminals of the voltage comparator are equal to each other. In this case, the level at each of the output terminals of the counters is no longer changed, such that the voltage at each of the address pins of the power supply control chip is stable, thus an address of the power supply control chip may be determined based on the voltage at each of the address pins.

BRIEF DESCRIPTION OF THE DRAWINGS

In order to describe technical solutions of the present disclosure more clearly, drawings to be used in the embodiments are introduced simply hereinafter. It is apparent that those skilled in the art can obtain other drawings based on these drawings without any creative work.

Figure 1:
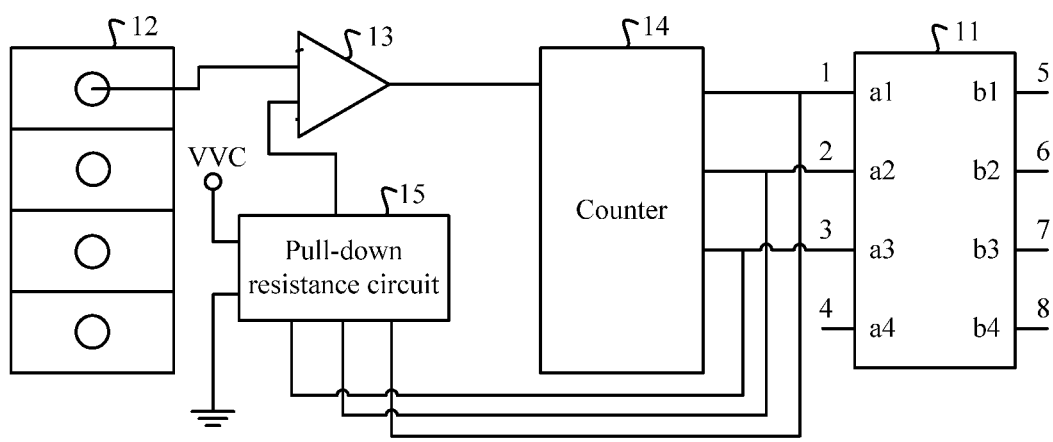
FIG. 1 is a schematic diagram of a power supply device according to an embodiment.

Reference numbers in the drawings are listed as follows:

| | |
|---|---|
| 11-power supply control chip, | 12-frist connector, |
| 13- voltage comparator, | 14-counter, |
| 15-resistance regulation circuit, | 151-first resistor, |
| 152-second resistor, | 153-third resistor, |
| 154-fourth resistor, | 155-fifth resistor, |
| 156-sixth resistor, | 157-first switch, |
| 158-second switch, | 159-third switch, |
| 21-second connector, | 22-pull-up resistor, |
| 23-pull-down resistor. | |

DETAILED DESCRIPTION

For enabling those skilled in the art to better understand the technical solutions in the present disclosure, the technical solutions in the embodiments of the present disclosure are described clearly and completely hereinafter in conjunction with the drawings in the embodiments of the present disclosure. It is apparent that the described embodiments are only some of the embodiments of the present application, rather than all embodiments. Based on the embodiments in the present disclosure, all of other embodiments, made by the person skilled in the art without any creative efforts, fall into the protection scope of the present disclosure.

A power supply device for supplying power to a server is provided according to an embodiment of the present disclosure. FIG. 1 is a schematic diagram of a power supply device according to an embodiment. As shown in FIG. 1, the power supply device according to the embodiment includes a power supply control chip 11 and a first connector 12. Each of pins of the power supply control chip 11 is connected to one of input terminals of the first connector 12. Some of the pins of the power supply control chip 11 are used as communication bus pins, one of the pins is used as a pin for detecting whether the power supply distribution panel is connected, and the other some of the pins are used as address pins for determining a distribution address of the power supply distribution panel.

A difference between the power supply device in the embodiment and a conventional power supply device is that, in the embodiment, the first connector 12 includes only one address input terminal. In addition to the above components, the power supply device according to the embodiment further includes a voltage comparator 13, a counter 14 and a resistance regulation circuit 15.

The resistance regulation circuit 15 includes a pull-up resistance circuit and a pull-down resistance circuit connected in series. The pull-up resistance circuit is connected to a positive electrode of a direct current power supply, and the pull-down resistance circuit is grounded. In the embodiment, the pull-up resistance circuit includes only one first resistor 151 with a certain resistance value. The pull-down resistance circuit includes multiple resistor branches and switches arranged in the resistor branches. A connection state of the resistor in each of the resistor branches may be controlled by controlling a switch in the resistor branch to be in an on state or an off state, to change the resistance value of the pull-down resistance circuit, so as to change a voltage at a connection point of the pull-up resistance circuit and the pull-down resistance circuit.

The voltage comparator 13 includes two input terminals, a first input terminal of the voltage comparator 13 is connected to the address input terminal of the first connector 12, a second input terminal of the voltage comparator 13 is electrically connected to the connection point of the pull-up resistance regulation circuit 15 and the pull-down resistance regulation circuit 15.

An input terminal of the counter 14 is connected to an output terminal of the voltage comparator, and each of the output terminals of the counter 14 is connected to one of the switches in the pull-down resistance circuit, such that the switch is controlled to be in the on state or the off state based on the state of an output level at the output terminal of the counter 14 itself. In addition, each of the output terminals of the counter is further connected to one of the address pins of the power supply control chip 11.

With the power supply device according to the embodiment, in a case where the power supply device is connected with the power supply distribution panel, the address input terminal of the voltage comparator 13 receives a voltage signal with a certain voltage value, and inputs the voltage signal to the first input terminal of the voltage comparator 13. The voltage comparator 13 compares the voltage signal at the first input terminal with a voltage signal at the second input terminal, and inputs a high level signal to the input terminal of the counter 14 in a case where the voltage signal at the first input terminal is different from the voltage signal at the second input terminal. The counter 14 performs accumulative counting in a case where the input terminal of the counter 14 receives the high level signal and output a signal with a corresponding level at each of output terminals. Each of the switches is controlled to be in an on state or an off state through one of the output terminals of the counter 14, to change the resistance value of the pull-down resistance circuit, so as to change the voltage at the second input terminal. The steps described above are repeated in a case where the voltage signal at the first input terminal is different from the voltage signal at the second input terminal, until the voltages at the two input terminals of the voltage comparator are equal to each other.

In a case where the voltage at the second input terminal is equal to the voltage at the first input terminal, the voltage comparator 13 transmits no level signal to the counter 14, thus a state of the level at each of the output terminals of the counter 14 is not changed. Since the state of the level at each of the output terminals of the counter 14 is not changed, the state of each of the switches of the pull-down resistance circuit is not changed, such that the resistance value of the pull-down resistance circuit is not changed. Since the resistance value of the pull-down resistance circuit is not changed, the voltage at the second input terminal is not changed, such that the states described above remain to be unchanged. Each of the output terminals of the counter 14 is connected to one of the address pins of the power supply control chip 11, since the state of the level at each of the output terminals of the counter 14 is not changed, each of the address pins of the power supply control chip 11 remains in a stable state continuously, such that an address of the power supply control chip 11 can be determined.

In a specific embodiment, the power supply control chip 11 of the power supply device has three address pins. Accordingly, the counter 14 is an octal counter 14. The pull-down resistance circuit has three switches. The pull-down resistance circuit may have a different equivalent resistance value in a case where at least one of the three switches is in a different state.

Figure 2:
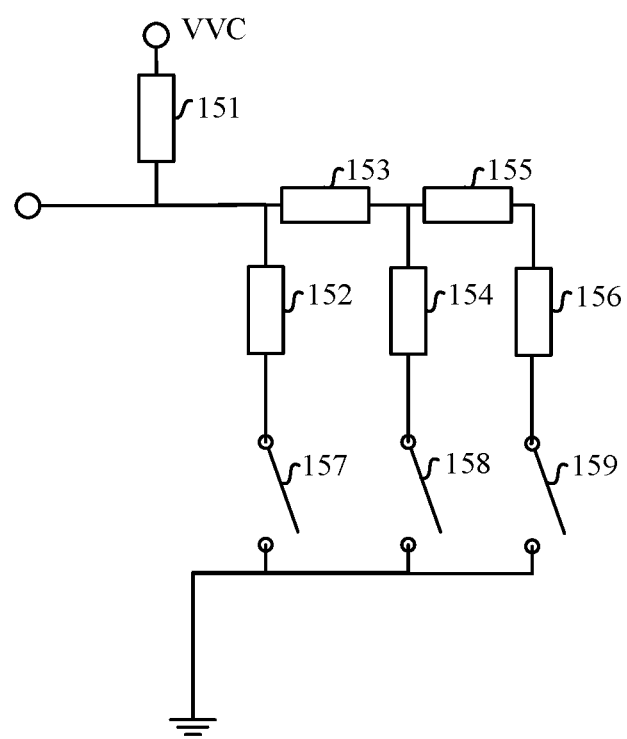
FIG. 2 is a schematic diagram of a pull-down resistance circuit according to an embodiment.

FIG. 2 is a schematic diagram of a pull-down resistance circuit according to an embodiment. As shown in FIG. 2, in the embodiment, the pull-down resistance circuit includes a first branch and a second branch connected in parallel. The first branch includes a second resistor 152 and a first switch 157. The second branch includes a third resistor 153, a third branch and a fourth branch. The third branch and the fourth branch are connected in parallel with each other to form a branch, and the branch is connected in series with the third resistor 153. The third branch includes a fourth resistor 154 and a second switch 158. The fourth branch includes a fifth resistor 155, a sixth resistor 156 and a third switch 159 connected in series. The first switch 157, the second switch 158 and the third switch 159 are respectively connected to the three output terminals of the counter 14, and are respectively controlled through the three output terminals of the counter 14.

In other embodiments, in a case where the power supply control chip 11 of the power supply device has N address pins, the counter is a $2^N$ counter 14, and the number of the switches is also N, such that the pull-down resistance circuit may have $2^N$ resistance values.

In the embodiment, the pull-down resistance circuit is provided with multiple switches, to change a voltage at a connection point of the pull-up resistance circuit and the pull-down resistance circuit. It can be convinced that in other embodiments, the switches may also be arranged in the pull-up resistance circuit, and the pull-down resistance circuit includes a resistor with a certain resistance value. Alternatively, in other embodiments, both the resistance value of the pull-down resistance circuit and the resistance value of the pull-up resistance circuit are changeable, to change the voltage at the connection point of the pull-down resistance circuit and the pull-up resistance circuit.

In the embodiment, preferably, the first resistor 151, the second resistor 152, the third resistor 153, the fourth resistor 154, the fifth resistor 155 and the sixth resistor 156 have the same resistance value R. It is assumed that a voltage of a direct current power supply is U, according to an equivalent circuit principle, in a case where the three switches are all turned off, the resistance value of the pull-down resistance circuit is 0. In a case where the third switch 159 is turned on and the first switch 157 and the second switch 158 are turned off, the resistance value of the pull-down resistance circuit is 3R. In a case where the third switch 159 and the first switch 157 are turned off, and the second switch 158 is turned on, the resistance value of the pull-down resistance circuit is 2R. In a case where the first switch 157 is turned on, the second switch 158 and the third switch 159 are turned off, the resistance value of the pull-down resistance circuit is R. In a case where the second switch 158 and the third switch 159 are turned on, the first switch 157 is turned off, the resistance value of the pull-down resistance circuit is 5R/3. In a case where the first switch 157 and the third switch 159 are turned on, and the second switch 158 is turned off, the resistance value of the pull-down resistance circuit is 3R/4. In a case where the first switch 157 and the second switch 158 are turned on and the third switch 159 is turned off, the resistance value of the pull-down resistance circuit is 2R/3. In a case where the first switch 157, the second switch 158 and the third switch 159 are all turned on, the resistance value of the pull-down resistance circuit is 5R/8.

In addition to the power supply device described above, a power supply management system based on the power supply device described above is further provided according to an embodiment of the present disclosure.

Figure 3:
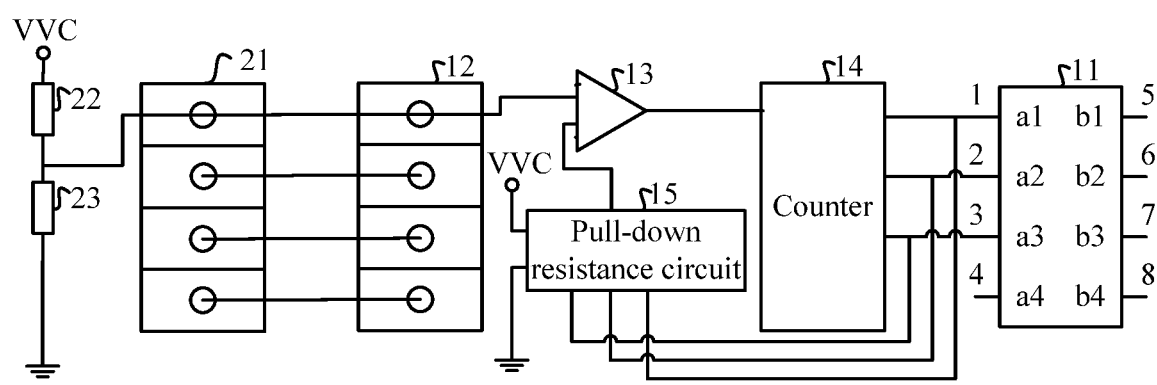
FIG. 3 is a schematic diagram of a power supply management system according to an embodiment.

FIG. 3 is a schematic diagram of a power supply management system according to an embodiment of the present disclosure. As shown in FIG. 3, the power supply management system according to the embodiment includes a power supply distribution panel and a power supply device connected with a power supply distribution panel.

The power supply distribution panel includes at least three second connectors 21, and each of the second connectors 21 is connectable to the first connector 12 of one power supply device. An address input terminal of each of the first connectors 12 is connected to a pull-up resistor 22 and a pull-down resistor 23. The pull-up resistor 22 is connected to a positive electrode of a direct current power supply, and the pull-down resistor 23 is grounded.

In the embodiment, a ratio between resistance values of the pull-up resistor 22 and the pull-down resistor 23 connected to the second connector 21 is equal to a ratio between resistance values of the pull-up resistance circuit and the pull-down resistance circuit of the power supply device connected with the second connector 21, such that connection states of the resistors of the power supply device are determined. A ratio between resistance values of the pull-up resistor 22 and the pull-down resistor 23 connected to one second connector 21 is different from that of the pull-up resistor 22 and the pull-down resistor 23 connected to another second connector 21, to avoid that resistance values of all the power supply devices are different from each other.

Preferably, in the embodiment, a resistance value of the pull-up resistor 22 is equal to a resistance value of the pull-up resistance circuit of the power supply device connected with the second connector 21. A resistance value of the pull-down resistor 23 is equal to a resistance value of the pull-down resistance circuit of the power supply device connected with the second connector 21.

The power supply device for supplying power to a server and the power supply management system according to the embodiments of the present disclosure are described in detail above. The principle and the embodiments of the disclosure are described by using specific examples, and the above embodiments are illustrated to assist in understanding a kernel concept of the present disclosure. It should be noted that all the other embodiments obtained by those skilled in the art without any creative work should fall within the protection scope of the present disclosure.

The invention claimed is:

1. A power supply device for supplying power to a server, comprising:
    a power supply control chip comprising address pins;
    a first connector configured to connect the power supply control chip to a power supply distribution panel, wherein the first connector comprises only one address input terminal;
    a voltage comparator;
    a counter comprising an input terminal and output terminals; and
    a resistance regulation circuit, wherein the resistance regulation circuit comprises a pull-up resistance circuit and a pull-down resistance circuit connected in series;
    a plurality of resistor branches and switches that are arranged in the pull-down resistance circuit, wherein each of the plurality of resistor branches is provided with one of the switches;
    an input terminal of the voltage comparator is connected to the address input terminal, and another input terminal of the voltage comparator is connected to a connection point of the pull-up resistance circuit and the pull-down resistance circuit, wherein the input terminal of the counter is connected to an output terminal of the voltage comparator, and each of the output terminals of the counter is connected to a respective one of the switches to control the respective one of the switches to be in an on state or an off state, and
    each of the output terminals of the counter is connected to a respective one of the address pins of the power supply control chip, wherein in a case where the number of the address pins of the power supply control chip is N, the counter is a $2^N$ counter, and the number of the switches is N.

2. The power supply device according to claim 1, wherein the counter is an octal counter comprising three output terminals,
    the pull-up resistance circuit comprises a first resistor,
    the pull-down resistance circuit comprises a first branch and a second branch connected in parallel,
    the first branch comprises a second resistor; the second branch comprises a third resistor, a third branch and a fourth branch, wherein the third branch and the fourth branch are connected in parallel with each other to form a branch, and the branch is connected in series with the third resistor,
    the third branch comprises a fourth resistor, and the fourth branch comprises a fifth resistor and a sixth resistor connected in series,
    the switches comprise a first switch, a second switch and a third switch, and
    the first switch is connected in series with the second resistor, the second switch is connected in series with the fourth resistor, and the third switch is connected in series with the fifth resistor.

3. The power supply device according to claim 2, wherein the first resistor, the second resistor, the third resistor, the fourth resistor, the fifth resistor and the sixth resistor have a same resistance value.

4. A power supply management system, comprising: a power supply distribution panel and a power supply device, wherein
    the power supply device comprises:
        a power supply control chip comprising address pins;
        a first connector configured to connect the power supply control chip to the power supply distribution panel, wherein the first connector comprises only one address input terminal;
        a voltage comparator;
        a counter comprising an input terminal and output terminals; and
        a resistance regulation circuit, wherein the resistance regulation circuit comprises a pull-up resistance circuit and a pull-down resistance circuit connected in series;
        a plurality of resistor branches and switches that are arranged in the pull-down resistance circuit, wherein each of the plurality of resistor branches is provided with one of the switches;
        an input terminal of the voltage comparator is connected to the address input terminal, and another input terminal of the voltage comparator is connected to a connection point of the resistance regulation circuit, wherein the input terminal of the counter is connected to an output terminal of the voltage comparator, and each of the output terminals of the counter is connected to a respective one of the switches to control the respective one of the switches to be in an on state or an off state, and
        each of the output terminals of the counter is connected to a respective one of the address pins of the power supply control chip, wherein in a case where the number of the address pins of the power supply control chip is N, the counter is a $2^N$ counter, and the number of the switches is N,
    the power supply distribution panel comprises at least three second connectors, each of the at least three second connectors is connectable to the first connector of the power supply device, wherein an address input terminal of each of the second connectors is connected to a pull-up resistor and a pull-down resistor,
    wherein when one of the at least three second connectors is connected to the first connector, a ratio between resistance values of a pull-up resistor and a pull-down resistor connected to the second connector that is connected to the first connector is equal to a ratio between resistance values of the pull-up resistance circuit and the pull-down resistance circuit of the power supply device, and a ratio between resistance values of a pull-up resistor and a pull-down resistor connected to one second connector is different from a ratio between resistance values of a pull-up resistor and a pull-down resistor connected to another second connector.

5. The power supply management system according to claim 4, wherein
a resistance value of the pull-up resistor connected to the second connector that is connected to the first connector is equal to a resistance value of the pull-up resistance circuit of the power supply device; and
a resistance value of the pull-down resistor connected to the second connector that is connected to the first connector is equal to a resistance value of the pull-down resistance circuit of the power supply device.

6. The power supply management system according to claim 4, wherein
the counter is an octal counter comprising three output terminals,
the pull-up resistance circuit comprises a first resistor,
the pull-down resistance circuit comprises a first branch and a second branch connected in parallel,
the first branch comprises a second resistor; the second branch comprises a third resistor, a third branch and a fourth branch, wherein the third branch and the fourth branch are connected in parallel with each other to form a branch, and the branch is connected in series with the third resistor,
the third branch comprises a fourth resistor, and the fourth branch comprises a fifth resistor and a sixth resistor connected in series,
the switches comprise a first switch, a second switch and a third switch, and
the first switch is connected in series with the second resistor, the second switch is connected in series with the fourth resistor, and the third switch is connected in series with the fifth resistor.

7. The power supply management system according to claim 6, wherein
the first resistor, the second resistor, the third resistor, the fourth resistor, the fifth resistor and the sixth resistor have a same resistance value.

8. The power supply management system according to claim 6, wherein
a resistance value of the pull-up resistor connected to the second connector that is connected to the first connector is equal to a resistance value of the pull-up resistance circuit of the power supply device; and
a resistance value of the pull-down resistor connected to the second connector that is connected to the first connector is equal to a resistance value of the pull-down resistance circuit of the power supply device.

9. The power supply management system according to claim 7, wherein
a resistance value of the pull-up resistor connected to the second connector that is connected to the first connector is equal to a resistance value of the pull-up resistance circuit of the power supply device; and
a resistance value of the pull-down resistor connected to the second connector that is connected to the first connector is equal to a resistance value of the pull-down resistance circuit of the power supply device.

\* \* \* \* \*